Figure 1:
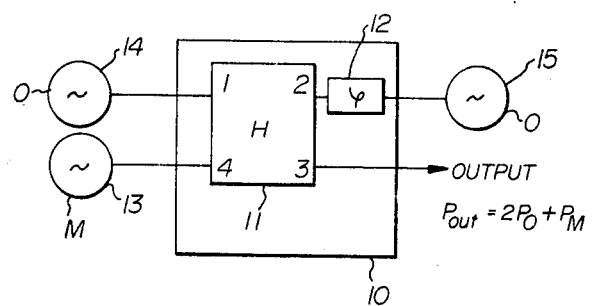

United States Patent [19]

Nigrin

[11] 4,048,583
[45] Sept. 13, 1977

[54] LOCKED HYBRID JUNCTION POWER COMBINER

[75] Inventor: Jan Nigrin, Edmonton, Canada

[73] Assignee: Canadian Patents and Development Limited, Ottawa, Canada

[21] Appl. No.: 707,194

[22] Filed: July 21, 1976

[51] Int. Cl.$^2$ ............................................. H03B 9/12
[52] U.S. Cl. ............................... 331/56; 331/107 R; 333/11
[58] Field of Search ....................... 333/11; 331/56, 96, 331/107 R, 107 G, 107 T; 330/53, 56

[56] References Cited
U.S. PATENT DOCUMENTS

| 2,759,099 | 8/1956 | Olive | 331/56 |
| 3,714,661 | 1/1973 | Kershaw | 333/11 |

*Primary Examiner*—John Kominski
*Attorney, Agent, or Firm*—James R. Hughes

[57] ABSTRACT

A locked hybrid junction power combiner comprises in its simplest version a single hybrid junction (0°, 180° and 90°) and an appropriate phase shifting element combining three one port oscillators (one master oscillator strongly locking the other oscillators). The combiner can be extended to combine any odd number of oscillators. Combining efficiency approaching 100% and locking figure of merit exceeding that of the master oscillator have been experimentally observed. Isolating the master oscillator from the hybrid by a circulator, the LHJ combiner can generate high microwave powers with spectral purity of the master oscillator; e.g. Impatt diode power capabilities may be combined with Gunn diode spectral purity. The combiner with an ordinary E-H waveguide hybrid junction can be employed to generate ultra-high microwave powers by combining high power tube sources.

8 Claims, 8 Drawing Figures

LOCKED HYBRID JUNCTION POWER COMBINER

This invention relates to a locked hybrid junction power combiner and more particularly to a power combiner employing a hybrid junction to combine microwave oscillators especially solid-state devices.

During the last few years great progress has been achieved in power handling capabilities of microwave solid state devices such as Impatt and Gunn diodes. Designers of microwave intelligence and communication systems need powers which are still a few times larger than those obtainable from present single semiconductor devices. Using various power combining methods, the needed power levels can be produced by means of solid-state devices.

Aside from a parallel or series combination of single devices, the power combining methods can be divided into three categories: (1) resonance method (single device oscillators are properly couples to a combining cavity) (2) travelling wave method (one oscillator which is isolated by a nonreciprocal element locks the other oscillators coupled to an ordinary transmission line); (3) hybrid circuit approach (pairs of single device oscillators are combined by means of one hybrid circuit). The following published papers outline the state of the art of these devices:

1. H.W. Thim, "Active microwave semiconductor devices". Proceedings of the 4th European Microwave Conference, pp. 1-15 Montreux 1974.
2. Kurokawa and F.M. Magalhaes, "An X-band 10 watt multiple-Impatt Oscillator", Proc. IEEE (Letters), Vol. 59, pp. 102-103, Jan. 1971.
3. R.S. Harp and H.L. Stover, "Power Combining of X-band Impatt Circuit Modules", 1973 IEEE ISSCC, pp. 118-119, Feb. 1973.
4. W.O. Schlosser and A.L. Stillwell, "A travelling-wave approach to the higher-power solid-state oscillator", Proc. IEEE (Letters) Vol. 56, pp. 1588, Sept. 1968.
5. S. Mizushina, "$2^n$ oscillators combined with 3dB directional couplers for output power summing", Proc. IEEE (Lett.) Vol. 55, pp. 2166-2167, Dec. 1967.
6. J.R. Nevarez, "Output power and loss analysis of $2^n$ injection oscillators combined through an ideal and symmetric hybrid combiner", IEEE Transactions on Microwave Theory and Techniques, Vol. MTT-17 pp. 1-10, Jan. 1969.
7. K. Kurokawa "The single Cavity multiple device oscillator", IEEE Transactions on Microwave Theory and Techniques, Vol. MTT-19, No. 10, pp. 793—801, Oct. 1971.

Generally, all power combining methods are prone to a moding problem. By introducing dissipative elements into the individual oscillators, the resonance approach can be freed of this problem. Obviously, the combining efficiency is slightly degraded. The present resonance methods are specially suited for combining of a large number of oscillators (many tens of watts have been achieved). Travelling wave approach utilizing uniform transmission line is impractical (the combiner cannot be injection locked because of the non-reciprocal element). The conventional hybrid circuit approach becomes impractical if more than two oscillators are to be combined and moding can be a serious problem (e.g., the individual oscillators of Nevarez' combiner, which required very accurate matching, are locked by very small signals leaking between the uncoupled arms, and, without any external locking signal, the combiner is bound to suffer from the moding problem as mentioned by Kurokawa in his paper; in reactively terminated combiners, the mutual coupling of the oscillators is stronger but multiple reflections within the combiner could be responsible for any instabilities.

It is an object of the invention to provide a power combiner that provides strong locking within the combining unit eliminating any instabilities.

This and other objects of the invention are achieved by a locked hybrid junction power combiner comprising a microwave hybrid junction (either 0°, 180°, or 90°) having four ports, three one port oscillators, one of the oscillators acting as a master and the other two as slaves, a phase shifting element positioned in one of the connections between the hybrid junction and an oscillator such as to provide appropriate phase relationships between the reflected waves and an optional four (and more) port circulator positioned between the master oscillator and the appropriate arm of the hybrid junction. This basic unit may be combined in modular fashion to achieve a composite combining unit combining more than three oscillators.

In drawings which illustrate embodiments of the invention.

Figure 2:
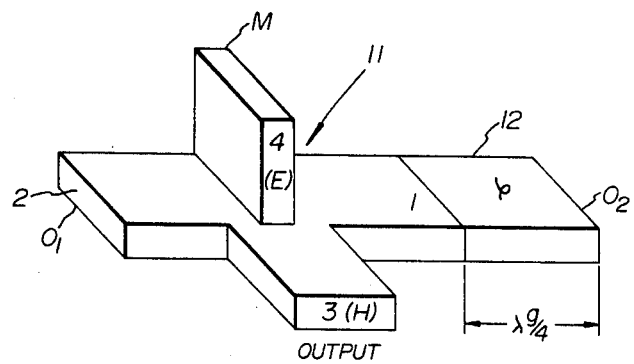
Figure 3:
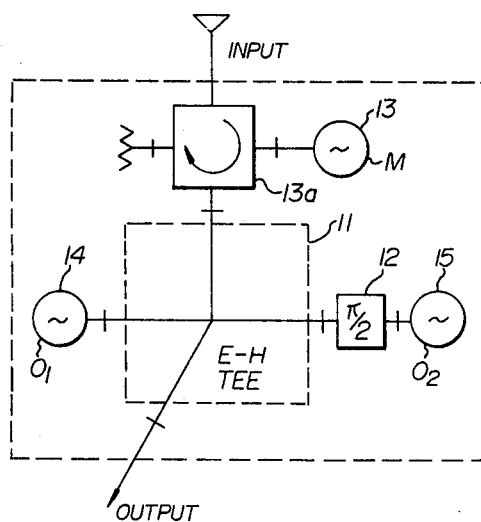
Figures 4, 5, 6:
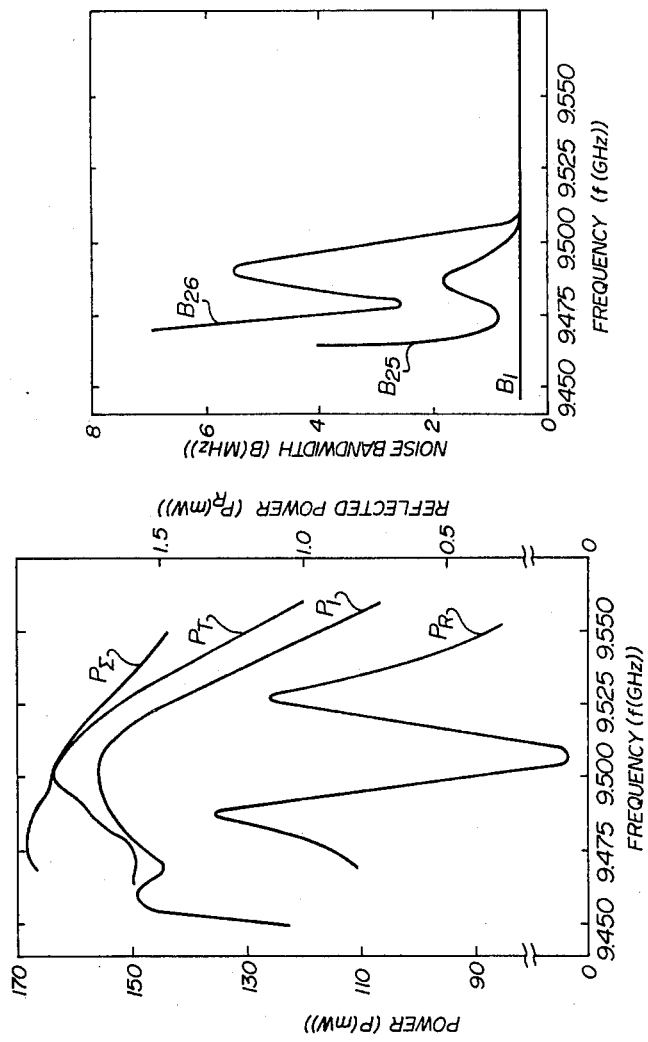
Figure 7B:
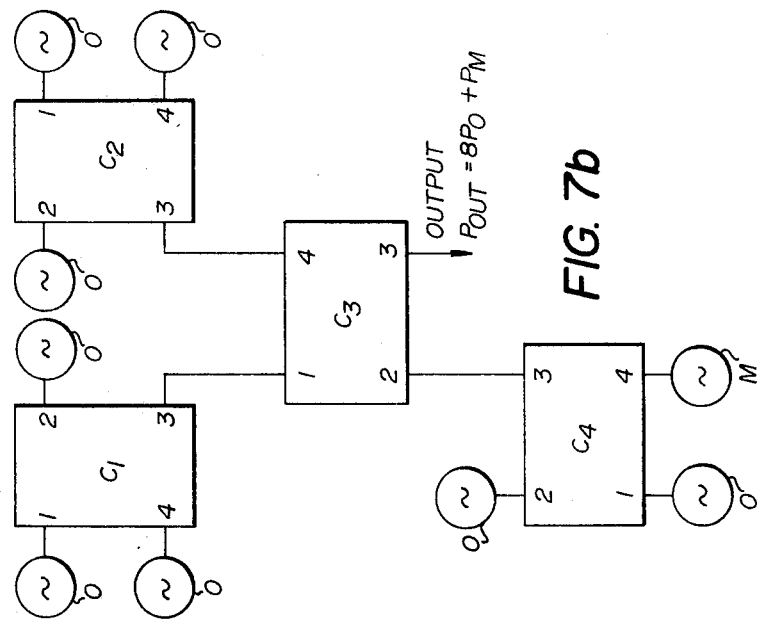
Figure 7A:
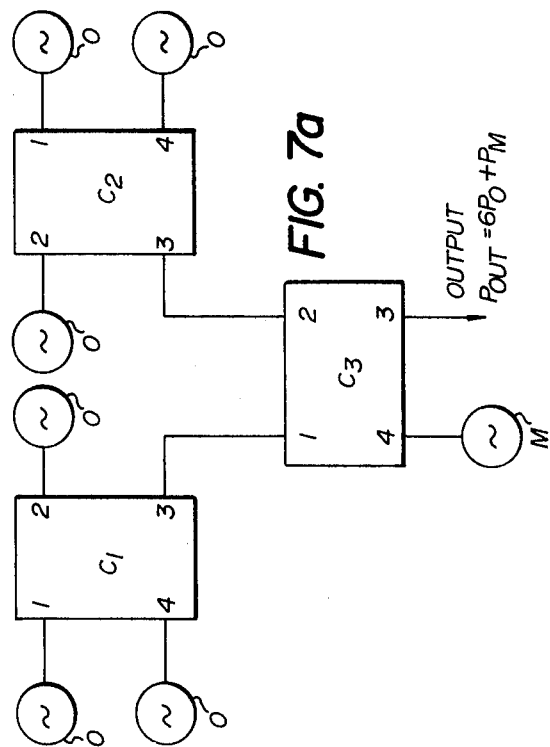

FIG. 1 is a circuit configuration of the basic locked hybrid junction power combiner unit with a H-hybrid junction and phase shifting element, FIG. 2 is a locked hybrid junction power combiner using an E-H hybrid, FIG. 3 is a circuit configuration of the isolated locked hybrid junction power combiner with separated input and output ports using an E-H hybrid and circulator, FIG. 4 shows the frequency dependence of the RF characteristics of the combiner, FIG. 5 shows the frequency dependence of the combiner noise bandwidth, FIG. 6 shows the dependence of the locking bandwidth of the combiner and master oscillator on the injected power, FIG. 7a and 7b show two possible arrangements of combining the basic unit into a composite device.

A basic unit of the locked hybrid junction (LHJ) power combiner 10 is schematically shown in FIG. 1 and consists of hybrid 11 (0°, 180° or 90°) with an appropriate phase-shifting element 12. In analogy with the conventional combiner, the LHJ combiner utilizes the ability of the hybrid junction to channel properly phased energy from its two arms through one of the remaining arms which then serves as the combiner output. In conventional hybrid junction combiners, two arms of the junction are loaded by oscillators to be combined, the third arm is terminated in a passive element (matched load or short) and the fourth arm being the combiner output. In the LHJ combiner, the third arm is terminated in an oscillator 13 which strongly locks the other two oscillators 14 and 15 thus forcing them to keep desired phase relationship. This behavior and the locking properties of the ideal LHJ combiner with matched waveguide E-H hybrid 11 (magic tee) shown in FIG..2 are briefly discussed in what follows.

Let us assume that the master oscillator M sends a wave $$a_M = \sqrt{2 P_M} \exp (j\omega_M t) \tag{1}$$

into the E arm of the magic tee. Assuming ideally matched tee, i.e. $S_{11} = S_{22} = S_{23} = S_{44} = S_{12} = S_{34} = 0$ and $S_{31} = S_{32} = S_{41} = -S_{42} = 1/\sqrt{2}$, the wave is equally split between the arms 1 and 2. The waves incident on the slave oscillators $O_1$ and $O_2$ are then given by $$b_1 = \sqrt{P_M} \exp j(\omega_M t - \pi/2) \quad (2)$$

$$b_2 = \sqrt{P_M} \exp j(\omega_M t - \pi) \quad (3)$$

If the oscillators $O_1$ and $O_2$ are well matched, both generating $P_o$ power at the same free-running angular frequency $\omega_o$, and characterized by the same locking figure of merit $N_o$ and if $$|\omega_M - \omega_o| < \frac{\eta_o \omega_o}{2} \sqrt{\frac{P_M}{2P_o}} = \Delta\omega_o \quad (4)$$

the oscillators $O_1$ and $O_2$ will be locked reflecting the following waves $$a'_1 = \sqrt{P_m = 2 P_o} \exp j(\omega_M t - \pi/2 + \alpha) \quad (5)$$

$$a_2 = \sqrt{P_M + 2 P_o} \exp j(\omega_M t - \pi + \alpha) \quad (6)$$

where $$\alpha = \sin^{-1} \frac{(\omega_M - \omega_o)}{\Delta\omega_o} \quad (7)$$

Because of an additional $\pi/2$ phase shift, the $a_1$ wave entering the magic tee is in phase with the $a_2$ wave. The $a_1$ and $a_2$ waves then constructively interfere in the 3 port resulting in the following output wave $$b_3 = \sqrt{2 P_M + 4 P_o} \exp j(\omega_M t - \pi + \alpha) \quad (8)$$

while no wave is leaving the junction via the E-arm 4 toward the master oscillator M. Thus there are only forward traveling waves in the ideal LHJ power combiner. Since the master oscillator sees then a matched load, it entirely controls the output frequency of the combiner while, under proper conditions, the output power of the combiner is the sum of the available powers of the oscillators.

To get information on the locking of the combiner one has to find the response of the combiner to the locking signal $$a_{3L} = \sqrt{2P_L} \exp j\omega_L t \quad (9)$$

injected through the arm 3. Repeating similar calculations as shown above, regarding the 0 oscillators, which operate under saturated conditions, as terminations characterized by the reflection coefficient $$\tau = |\tau| \exp(-j\gamma) \quad (10)$$

the master oscillator will be affected by the locking signal $$b_{4L} = |\tau| 2\sqrt{P_L} \exp j(\omega_L t - \gamma - \pi) \quad (11)$$

if $$|\omega_L - \omega_M| < \frac{\eta_M \omega_M}{2} |\tau| \sqrt{\frac{P_L}{P_M}} = \Delta\omega_M \quad (12)$$

the master oscillator will be locked sending the wave $$a_{ML} = \sqrt{2P_M} \exp j(\omega_L t - \gamma - \pi - \psi) \quad (13)$$

instead of the $a_M$ wave into the hybrid junction. In (13)

$$\psi = \sin^{-1} \frac{(\omega_L - \omega_M)}{\Delta\omega_M} \quad (14)$$

the combiner output wave is then given by $$b_{3L} = \sqrt{2P_M + 4P_o} \exp j(\omega_L t - \gamma + \pi + \psi) \quad (15)$$

If $\alpha$ and $\gamma$ were small, the steady state phase angle between the combiner output and the locking signal would be given by (14) and the combiner effective locking figure of merit would be given by $$\eta_c = \eta_M |\tau| \sqrt{\frac{P_M + 2P_o}{P_M}} \quad (16)$$

(note that for $|\tau|$ close to unity $\eta_c$ could be larger than $\eta_M$)

The deterministic components of the 0 oscillators behave as discussed above. However, the uncorrelated noise components of the 0 oscillators are not cancelling each other in the E arm of the hybrid, they are instead algebraically adding, and the combiner noise approaches the sum of the noise of all three oscillators. Using a circulator 13 to isolate the master oscillator from the hybrid 11 as shown in FIG. 3, the noise components of the oscillators are drastically attenuated before reaching the master oscillator and then the combiner output frequency, noise and locking properties, if the external locking signal is applied to the input port of the circulator as shown in FIG. 3, are controlled by only the master oscillator.

In experimental tests Impatt diode oscillators have been combined using a commerical waveguide magic tee (in the frequency range 9.47–9.53 GHz, VSWR in all arms of the match terminated tee is better than 1.05). The phase-shifting element introduces a $\pi/2$ phase shift at 9.505 GHz. By proper choice of bias currents, the output powers of the oscillators $O_1$ and $O_2$ are made almost the same in the frequency range 9.45–9.55 GHz. One matching and one tuning screw at each oscillators were used to achieve the desired RF characteristics. The selection of the pair of ports for the output and master oscillator does not have any effect on the characteristics of an ideal combiner. However, in not well matched magic tees or in ordinary E-H tees, the selection of the ports containing the plane of symmetry i.e. E and H ports, makes the combiner stable in a wider frequency range.

It was found that the combiner could generate single frequency spectrum for very different tuning of individual oscillators. The combiner frequency was equally controlled by any of the oscillators. Generally, the tuning was not smooth and repeatable - jumps in frequency, output power and noise were often observed. In the locked mode, when the 0 oscillators were large-signal-matched, the combiner performed very well. The best characteristics were achieved with the 0 oscillators heavily overcoupled so that they were barely self-oscillating (the oscillators generated 3mW and 10 mW at their respective free-running frequencies of 0.519 and 9.517 GHz - their available output powers were about 50 mW). By critically coupling the master oscillator, the combining efficiency could be maximized while achieving good noise performance and overall stability. Since the power reflected by a mismatched load at the combiner output is amplified before it gets back to the unisolated master oscillator, a tuner may be sometimes needed in front of the load to ensure proper operation.

Typical characteristics of the combiner are shown in FIGS. 4–6. In the locked mode, the master oscillator dominates and controls the combiner characteristics over the widest frequency range. A typical dependence of the combiner output power on the frequency (the 0 oscillators remain fixed tuned while only the master oscillator is tuned) is shown in FIG. 4. Within the combiner tuning range, which is defined as the frequency range where the combiner generates a single frequency spectrum, the output power is not constant and peaks somewhere in the middle. The combiner remains in a stable operation in a range exceeding 100 MHz. The combining efficiency is close to 100% in an almost 10 MHz range, compare the curve $P_T$ showing the combiner available power with the curve $P_\Sigma$ showing the sum of available powers of the combined oscillators. If all three ocillators are simultaneously tuned, almost 100% combining efficiency can be achieved in a few hundred MHz range. The combining efficiency of the isolated combiner is slightly degraded as indicated by the $P_I$ curve showing the tuning characteristic of the combiner with the circulator isolated master oscillator. The frequency dependence of the power reflected back to the master oscillator is shown by the $P_R$ curve. Obviously, the 0 oscillators are well matched in the frequency range where the output power peaks.

The frequency dependence of the combiner noise bandwidth, B, defined as the width of the output specturm at a power level 50 dB below that at the centre frequency, is shown in FIG. 5. The noise bandwidth of the master oscillator is about 0.3 MHz and is almost frequency independent while that of the 0 oscillators depends on the loading conditions and can vary from 0.3 MHz to as much as 7 MHz. The combiner noise bandwidth is large in the lower frequency range, it depends on the conditions of the 0 oscillators; curves $B_{25}$ and $B_{26}$ have been measured for the $0_1$ oscillator biased to 25 and 26 mA, and it sharply increases when approaching the lower frequency limit of the stable operation. In the upper frequency range, the combiner noise bandwidth approaches that of the master oscillator. The noise bandwidth of the isolated combiner approaches that of the master oscillator as indicated by the $B_I$ curve.

The dependence of the locking bandwidth on the injected power is shown in FIG. 6 by the curve $I_C$ for the LHJ combiner, curve $L_{IC}$ for the ILHJ combiner and curve $L_M$ for the master oscillator itself. At small locking powers, the combiner behaves as a single tuned oscillator and its characteristics remain almost unchanged in the frequency range 9.49–9.51 GHz. Since the small signal locking bandwidth of the LHJ combiner slightly exceeds that of the isolated combiner, the effective locking figure of merit of the combiner is larger than that of the master oscillator by a factor $\sqrt{P_T/P_M}$.

The basic unit of the Locked Hybrid Junction power combiner of the Isolated Locked Hybrid Junction combiner can combine three sources of microwave energy with almost 100% efficiency and its output frequency, spectrum and locking properties being determined by the master oscillator. Experimental results have clearly shown that the characteristics of real combiners with a waveguide magic tee closely approach those predicted for the ideal combiners. In a properly adjusted combiner, no moding problems are encountered.

The basic unit of ILHJ combiner can be used for generation of cleam microwave power at Impatt diode power levels if a Gunn diode master oscillator is used. Thus power levels in excess of 10 W with spectral purity of Gunn diode oscillators can be presently achieved using only one hybrid junction. If all oscillators are of Impatt diode type, output power levels close to 20 W at frequencies around 10 GHz can be generated by means of solid-state devices.

If higher power levels are needed, the combiner can be extended in a modular fashion. Generally, output power approaching $$P_T = (2J) P_o + P_M$$

can be generated by means of a combiner using J hybrids, (2J) identical oscillators delivering the $P_o$ available power and one master oscillator with the $P_M$ available power (in conventional hybrid combiners, (2J-1) hybrids are needed to combine (2J) oscillators). Thus three hybrids are needed to combine seven oscillators, see FIG. 7a, and four hybrids are needed to combine nine oscillators, see FIG. 7b. If spectral purity is desired, the master oscillator have to be isolated by a circulator as shown in FIG. 3.

At very high power levels, it is hardly economical to develop extra high power tubes for a few specialized applications while nearly all combining methods suffer from the moding problem. The LHJ power combiner based on an ordinary E-H waveguide tee capable of withstanding high RF voltages seems to be the most promising alternative here.

I claim:

1. A locked hybrid junction power combiner comprising:
   a. a microwave hybrid junction having four ports, one of which acts as an output port,
   b. three one port oscillators connected to the other three ports, one of the oscillators acting as a master oscillator and the other two as slave oscillators locked to the master,
   c. a phase-shifting element positioned in one of the connections between one of the ports of the hybrid junction and an oscillator such as to provide an output that has correct phase relation and combines the powers of the three oscillators,
   d. four port circulator positioned between the master oscillator and the appropriate arm of the hybrid junction.

2. A locked hybrid junction power combiner as in claim 1 wherein the hybrid junction is one of the 0° or, 180°.

3. A locked hybrid junction power combiner as in claim 1 wherein the hybrid junction is a magic tee hybrid.

4. A locked hybrid junction power combiner as in claim 1 wherein the one port oscillators are solidstate one-port oscillators.

5. A locked hybrid junction power combiner as in claim 1 wherein the one port oscillators are vacuum tube one-port oscillators.

6. A locked hybrid junction power combiner as in claim 1 wherein the master oscillator is a Gunn diode oscillator and the slave oscillators are Impatt diode oscillators.

7. A composite hybrid junction power combiner comprising one or more combiner units as in claim 1 but with only one of the oscillators acting as the master.

8. A locked hybrid junction power combiner comprising:
   a. a microwave hybrid junction of the 90° type having four ports, one of which acts an an output port,
   b. three one-port oscillators connected to the other three ports, one of the oscillators acting as a master oscillator and the other two as slave oscillators locked to the master, and
   c. a four port circulator positioned between the master oscillator and the appropriate arm of the hybrid junction.

* * * * *